(12) United States Patent
Hsieh et al.

(10) Patent No.: US 7,609,114 B2
(45) Date of Patent: Oct. 27, 2009

(54) VOLTAGE GENERATING APPARATUS AND METHODS

(75) Inventors: Chung-An Hsieh, Taipei (TW); Cheng-Tao Li, Taipei (TW)

(73) Assignee: UPI Semiconductor Corporation, Taipei (TW)

( * ) Notice: Subject to any disclaimer, the term of this patent is extended or adjusted under 35 U.S.C. 154(b) by 23 days.

(21) Appl. No.: 12/153,865

(22) Filed: May 27, 2008

(65) Prior Publication Data

US 2009/0058533 A1    Mar. 5, 2009

Related U.S. Application Data

(60) Provisional application No. 60/969,872, filed on Sep. 4, 2007.

(51) Int. Cl.
   *H03F 3/04* (2006.01)

(52) U.S. Cl. .................................................. 330/297

(58) Field of Classification Search .................. 330/51, 330/127, 207 A, 251, 297
   See application file for complete search history.

(56) References Cited

U.S. PATENT DOCUMENTS 5,289,137 A   2/1994  Nodar et al.
7,061,327 B2  6/2006  Doy
7,382,195 B2*  6/2008  Chen et al. .................. 330/297
7,471,155 B1* 12/2008  Levesque .................... 330/297

\* cited by examiner

*Primary Examiner*—Khanh V Nguyen
(74) *Attorney, Agent, or Firm*—Birch, Stewart, Kolasch & Birch, LLP

(57) ABSTRACT

The invention provides a voltage generating apparatus for powering at least one amplifier. The voltage generating apparatus comprises a voltage source, a switched capacitor voltage converter and a voltage detector. The voltage source supplies a first voltage to a positive voltage input terminal of the at least one amplifier. The first voltage is a positive DC voltage. The switched capacitor voltage converter is coupled to the voltage source for outputting an output voltage to a negative voltage input terminal of the at least one amplifier according to the first voltage and a predetermined voltage. The output voltage is a negative DC voltage. The voltage detector is coupled to the switched capacitor voltage converter for determining a switching frequency corresponding to the predetermined voltage according to the output voltage. The switched capacitor voltage converter increases the output voltage when the switching frequency is decreased and decreases the output voltage when the switching frequency is increased.

14 Claims, 5 Drawing Sheets

_US 7,609,114 B2_

VOLTAGE GENERATING APPARATUS AND METHODS

BACKGROUND OF THE INVENTION CROSS REFERENCE TO RELATED APPLICATIONS

This application claims the benefit of U.S. Provisional Application No. 60/969,872, filed Sep. 4, 2007, the entirety of which is/are incorporated by reference herein.

BACKGROUND OF THE INVENTION

1. Field of the Invention

The invention relates to power supply devices, and more particularly to a voltage generating apparatus and methods for reducing power dissipation and allowing voltage compensation for driving amplifiers.

2. Description of the Related Art

Amplifiers, such as operational amplifiers, are well know in the field of electronic circuits for providing amplification of input signals to drive a variety of electrical loads such as audio speakers. For example, U.S. Pat. No. 7,061,327 illustrates a headphone driver amplifier operative from a single voltage supply, thereby driving headphone speakers. Also, an operational amplifier driven by a charge pump with a single supply voltage is disclosed in U.S. Pat. No. 5,289,137.

According to the prior art, an operational amplifier is operative in an operating range to properly drive electrical loads over the operating range. For example, it is necessary for an operational amplifier to provide a sufficiently broad range that spans from a specific negative voltage (such as −5 volts) up to a specific positive voltage (such as +5 volts) so as to assure the full amplification of input signals. However, in prior art systems, ripple effects, transients, or other disruptive occurrences may instantaneously produce voltage shot or spike of the specific negative voltage, thereby affecting the lower limit of the operating range. Consequently, a magnitude of amplification of an input signal from the operational amplifier accordingly deteriorates. This is particularly a problem for an operational amplifier powered by dual voltage signals, such as −5 and +5 volts, providing full amplification of input signals.

Some conventional methods are provided for increasing the operating range of the amplifier. As the operating range of the amplifier increases, power dissipation is accordingly increased, thus decreasing the efficiency of the system.

In view of the aforementioned, a need exists to provide a voltage generating apparatus that can derive a stable negative voltage in response to input signals. In addition, there is a need for a voltage generating apparatus that is capable of reducing fluctuations in the negative voltage and providing a stable desired output voltage level based on user needs, thereby making the generation of the negative voltage more reliable and predictable.

BRIEF SUMMARY OF THE INVENTION

In one aspect, the invention provides a voltage generating apparatus for powering an amplifier. The voltage generating apparatus comprises a voltage source, a switched capacitor voltage converter and a voltage detector. The voltage source supplies a first voltage to a positive voltage input terminal of the at least one amplifier. The first voltage is a positive DC voltage. The switched capacitor voltage converter is coupled to the voltage source for outputting an output voltage to a negative voltage input terminal of the at least one amplifier according to the first voltage and a predetermined voltage. The output voltage is a negative DC voltage. The voltage detector is coupled to the switched capacitor voltage converter for determining a switching frequency corresponding to the predetermined voltage according to the output voltage. The switched capacitor voltage converter increases the output voltage when the switching frequency is decreased and decreases the output voltage when the switching frequency is increased.

In a further aspect of the invention, a voltage generating method is provided for driving at least one amplifier. The voltage generating method comprises the steps of providing a first voltage to a positive voltage input terminal of the at least one amplifier, wherein the first voltage is a positive DC voltage. Next, an output voltage is generated according to the first voltage and a predetermined voltage, wherein the output voltage is a negative DC voltage. Also, the output voltage is supplied to a negative voltage input terminal of the at least one amplifier and a switching frequency corresponding to the predetermined voltage according to the output voltage is determined. The output voltage is increased when the switching frequency is decreased and is decreased when the switching frequency is increased.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
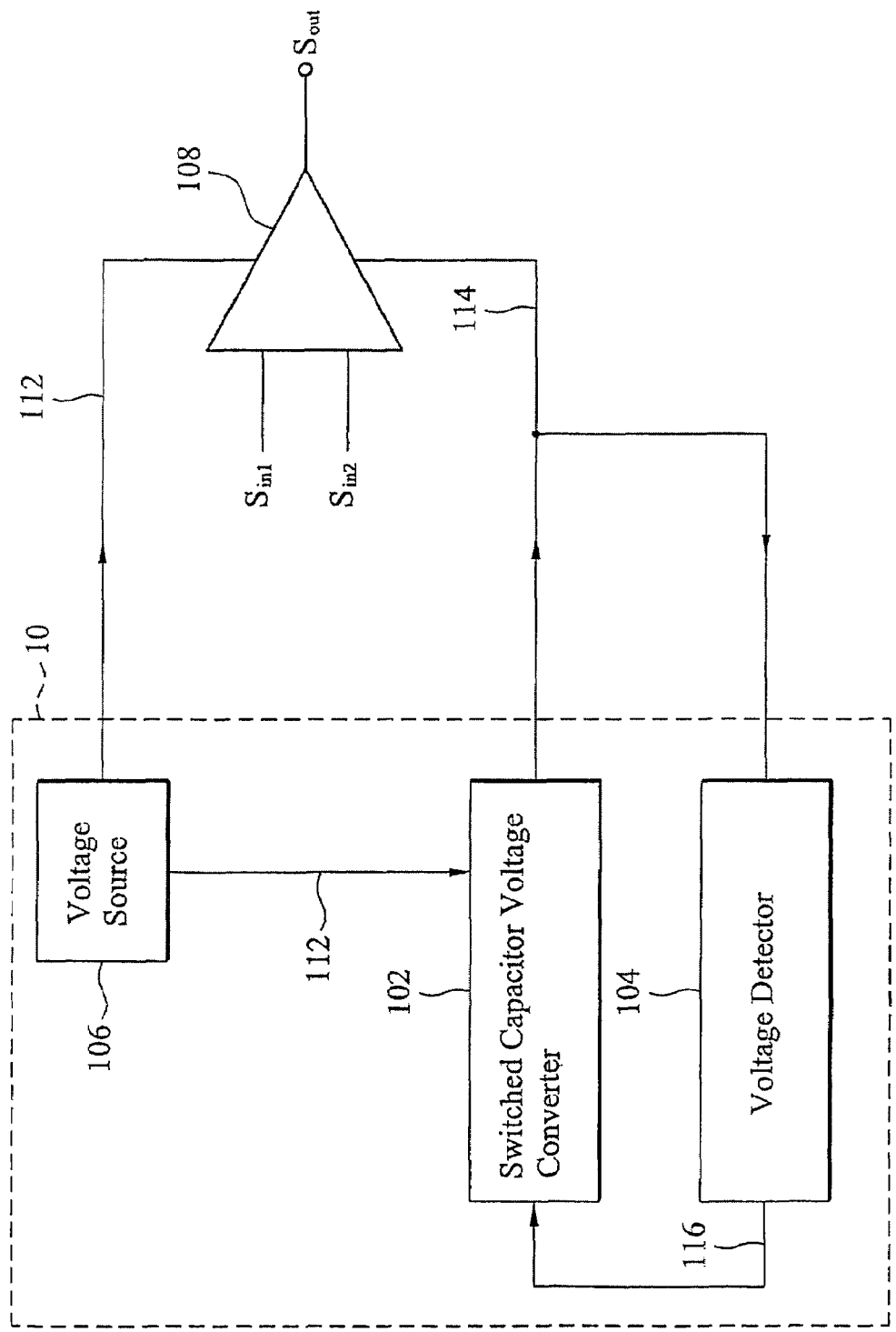
FIG. 1 is a block diagram of a voltage generating apparatus for driving an amplifier in accordance with one embodiment of the invention.

FIG. 1 is a block diagram of a voltage generating apparatus 10 for driving an amplifier 108 in accordance with one embodiment of the invention. The voltage generating apparatus 10 comprises a voltage source 106, a switched capacitor voltage converter 102 and a voltage detector 104. The voltage source 106 is provided for generating a first voltage 112, where the first voltage 112 is a positive DC voltage outputted to a positive voltage input terminal of the amplifier 108. The switched capacitor voltage converter 102 coupled to the voltage source 106 receives the first voltage 112 and delivers an output voltage 114 to a negative voltage input terminal of the amplifier 108, where the output voltage is a negative DC voltage. In other words, the amplifier 108 is connected to an upper supply rail of the first voltage 112 and a lower supply rail of the output voltage 114. The voltage detector 104 is coupled to the switched capacitor voltage converter 102 for determining a switching frequency 116 corresponding to a predetermined voltage (not shown) according to the output voltage 114. The operation of the voltage detector 104 is described below in more detail. In the illustrated embodiment, the switched capacitor voltage converter 102 increases the output voltage 114 when the switching frequency is decreased. Further, the output voltage 114 is decreased when the switching frequency is increased As shown in FIG. 1, the first voltage 112 and the output voltage 114 are provided for powering the amplifier 108. The amplifier 108 has a pair of signal input terminals to receive and amplify signals $S_{in1}$ and $S_{in2}$, such as audio signals for speakers, so that a full swing of an amplified signal $S_{out}$ obtained therefrom can be achieved. The amplifier 108 used in this embodiment is preferably an operational amplifier, such as a dual input bipolar operational amplifier. It is noted that signal amplification from the amplifier 108 of one signal can also be applicable.

According to this embodiment, the voltage detector 104 is provided for compensating the variation of the output voltage 114, thereby maintaining the lower limit of the operating range of the amplifier 108. When the aforesaid variation is detected by the voltage detector 104, the switching frequency 116 is then determined, thereby generating the predetermined voltage from the switched capacitor voltage converter 102. Accordingly, the output voltage 114 is compensated by the switching frequency 116. For example, when the output voltage 114 is increased, the switching frequency 116 is attenuated to control the charge time of a predetermined capacitor (not shown) in the switched capacitor voltage converter 102, thereby reducing the predetermined voltage to compensate for the output voltage 114. Moreover, the switching frequency 116 is decreased to raise the predetermined voltage of the switched capacitor voltage converter 102, thereby compensating for the voltage drop of the output voltage 114.

In operation, the switched capacitor voltage converter 102 and the voltage detector 104 operate so the output voltage 114 is set as function of the first voltage 112 and the predetermined voltage corresponding to the switching frequency 116, described as follow:

$$V_{out} = -V_{in} + V_c,$$

where "$V_{out}$" indicates the output voltage 114 derived from the switched capacitor voltage converter 102 according to FIG. 1, "$V_{in}$" indicates the first voltage 112 generated from the voltage source 106, and "$V_c$" indicates the predetermined voltage corresponding to the switching frequency 116 from the voltage detector 104.

Figure 2:
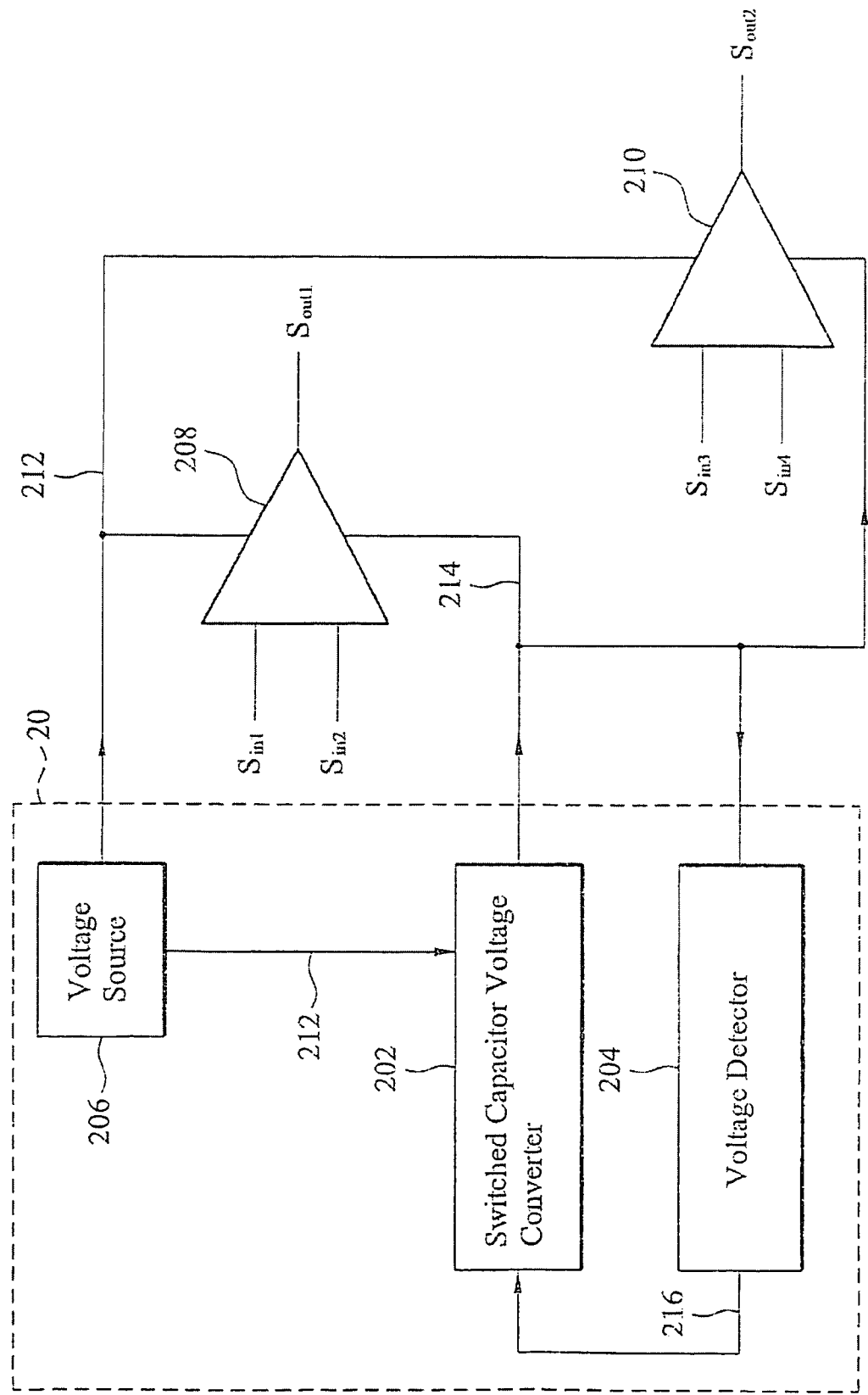
FIG. 2 is a block diagram of a voltage generating apparatus for driving two amplifiers in accordance with another embodiment of the invention.

FIG. 2 is a block diagram of a voltage generating apparatus 20 for driving two amplifiers 208 and 210 in accordance with another embodiment of the invention. In this embodiment, the voltage generating apparatus 20 comprises a voltage source 206, a switched capacitor voltage converter 202 and a voltage detector 204. Note that the operations of the voltage source 206, the switched capacitor voltage converter 202 and the voltage detector 204 are substantially similar to corresponding units of FIG. 1, and hence, further description thereof is omitted.

As shown in FIG. 2, the voltage generating apparatus 20 provides a first voltage 212 and an output voltage 214 for respectively operating as upper supply rails and lower supply rails of two amplifiers 208 and 210. In order for the amplifiers 208 and 210 to provide full amplification of signals $S_{in1}$, $S_{in2}$, $S_{in3}$ and $S_{in4}$, an adequate operating range of driving voltage supplied from the first voltage 212 and the output voltage 214 is required. In this case, the switched capacitor voltage converter 202 is used to stabilize the voltage level of the output voltage 214. Therefore, as the output voltage 214 varies, the switched capacitor voltage converter 202 adjusts the value of the first voltage 212 according to a predetermined voltage in response to a switching frequency 216 from the voltage detector 204, so as to maintain a stable output voltage 214.

Furthermore, when the negative magnitude of an input signal (such as signal $S_{in1}$ in FIG. 1) increases (or decreases), the lower limit of the operating range to power the amplifier (such as the amplifier 108 in FIG. 1) also needs to be correspondingly increased (or decreased). Thus, an extra control to assure full amplification of the input signal is required.

Figure 3:
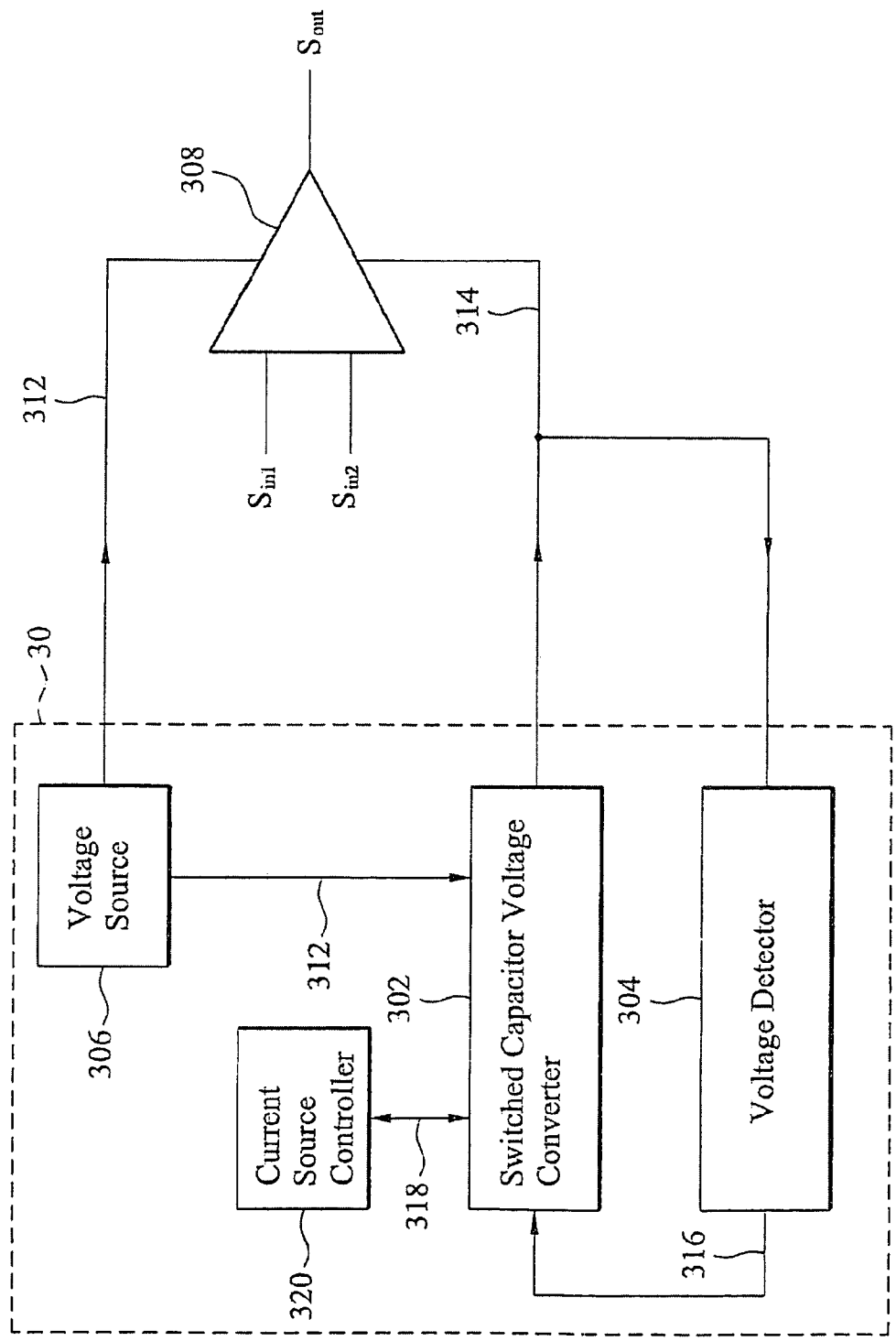
FIG. 3 is a block diagram of a voltage generating apparatus for driving an amplifier in accordance with still another embodiment of the invention.

FIG. 3 is a block diagram of a voltage generating apparatus 30 for driving an amplifier 308 in accordance with still another embodiment of the invention. Referring to FIG. 3, a current source controller 320 is further provided for supplying an extra voltage 318 to a switched capacitor voltage converter 302 so as to directly adjust an output voltage 314. The extra voltage 318 is determined by modulating a current flowing in or flowing from the switched capacitor voltage converter 302. Therefore, when the negative magnitude of the input signals $S_{in1}$ and $S_{in2}$ is changed, full amplification of the variable input signals $S_{in1}$ and $S_{in2}$ is accomplished. Note that structures and operations in the voltage generating apparatus 30 are similar to those of FIG. 1, and hence, further description thereof is omitted for brevity.

Figure 4:
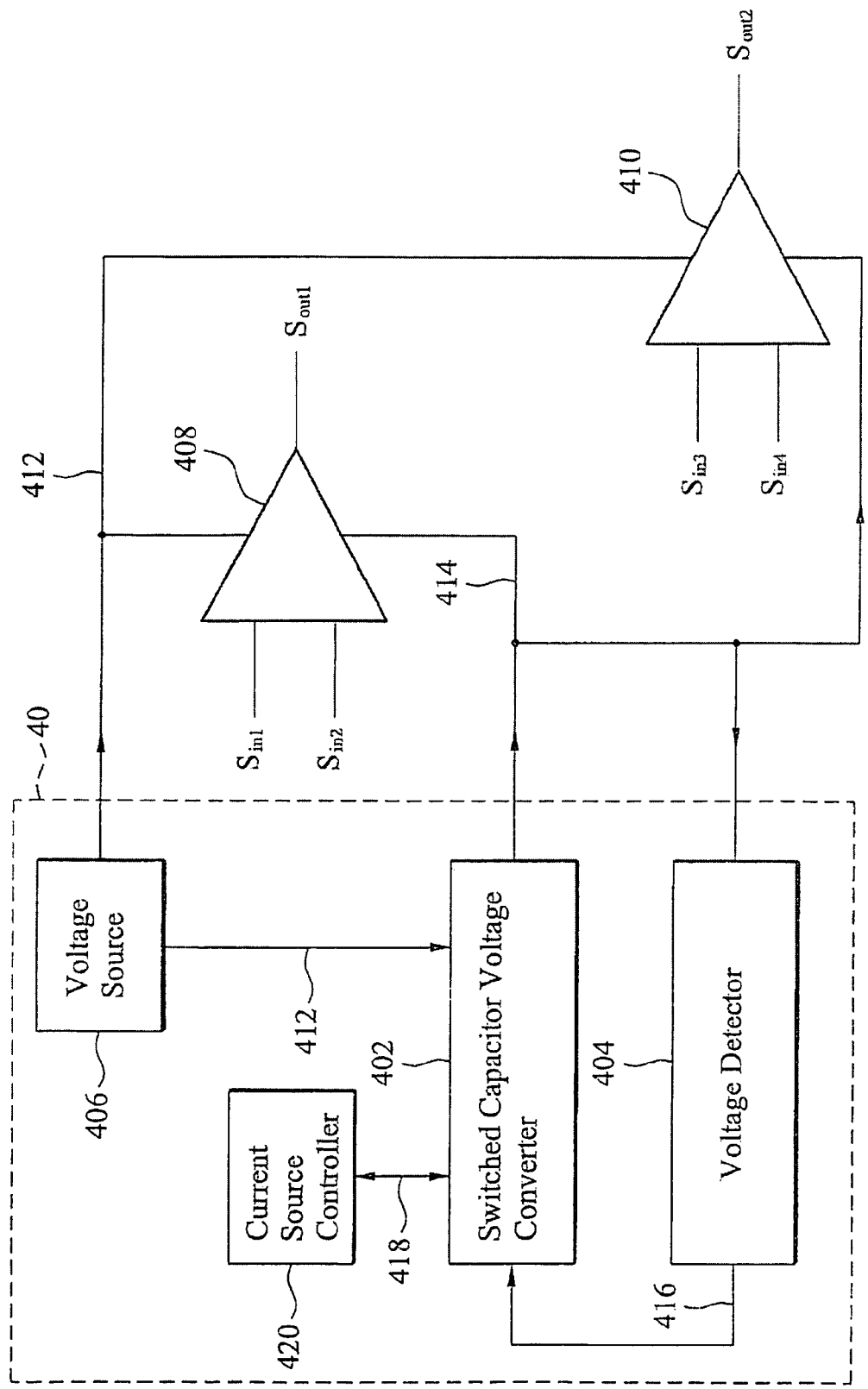
FIG. 4 is a block diagram of a voltage generating apparatus for driving two amplifiers in accordance with still another embodiment of the invention.

FIG. 4 is a block diagram of a voltage generating apparatus 40 for driving two amplifiers 408 and 410 in accordance with still another embodiment of the invention. In this embodiment, as described above, the voltage generating apparatus 40 provides two voltages 412 and 414 to drive amplifiers 408 and 410. Note that the connection and function of a switched capacitor voltage converter 402, a voltage detector 404 and a voltage source 406 in FIG. 4 are substantially the same with those of FIG. 2, and thus, detailed descriptions are omitted for brevity.

According to this embodiment, when the negative magnitude of the input signals $S_{in1}$, $S_{in2}$, $S_{in3}$ or $S_{in4}$ is altered, the voltage generating apparatus 40 is capable of adjusting the output voltage 414 by an extra voltage 418 obtained from a current source controller 420. Also, description has been given of a situation in which the output voltage 414 becomes unstable in the aforementioned embodiment accompanying FIG. 2. The ability for the output voltage 414 to be compensated by the switched capacitor voltage converter 402 and the voltage detector 404, for example, can be expressed as below:

$$V_{out} = -V_{in} + V_c + (+/-V_{ei}),$$

where "$V_{out}$" represents the output voltage 414 derived from the switched capacitor voltage converter 402 shown in FIG. 4, "$V_{in}$" represents the first voltage 412 obtained from the voltage source 406, "$V_c$" represents a predetermined voltage corresponding to a switching frequency 416 from the voltage detector 404, and "$V_{ei}$" represents the extra voltage 418 provided for directly adjusting the output voltage 414.

In this case, when the current source controller 420 controls the current flowing from the switched capacitor voltage converter 402, the output voltage is accordingly increased. In addition, when the current source controller 420 controls the current flowing into the switched capacitor voltage converter 402, the output voltage is then reduced. However, in other cases, the direction of the current flow may be reversed to adjust the output voltage 414 based on the design of the switched capacitor voltage converter 402 and the voltage source 406.

It is also noted that the two amplifiers shown in FIGS. 2 and 4 for amplification are merely exemplary embodiments, and those skilled in the art may adjust the number of amplifiers to more than two amplifiers with the first voltage and the output voltage according to design necessity and components employed thereof while conforming with the principles of the invention.

Figure 5:
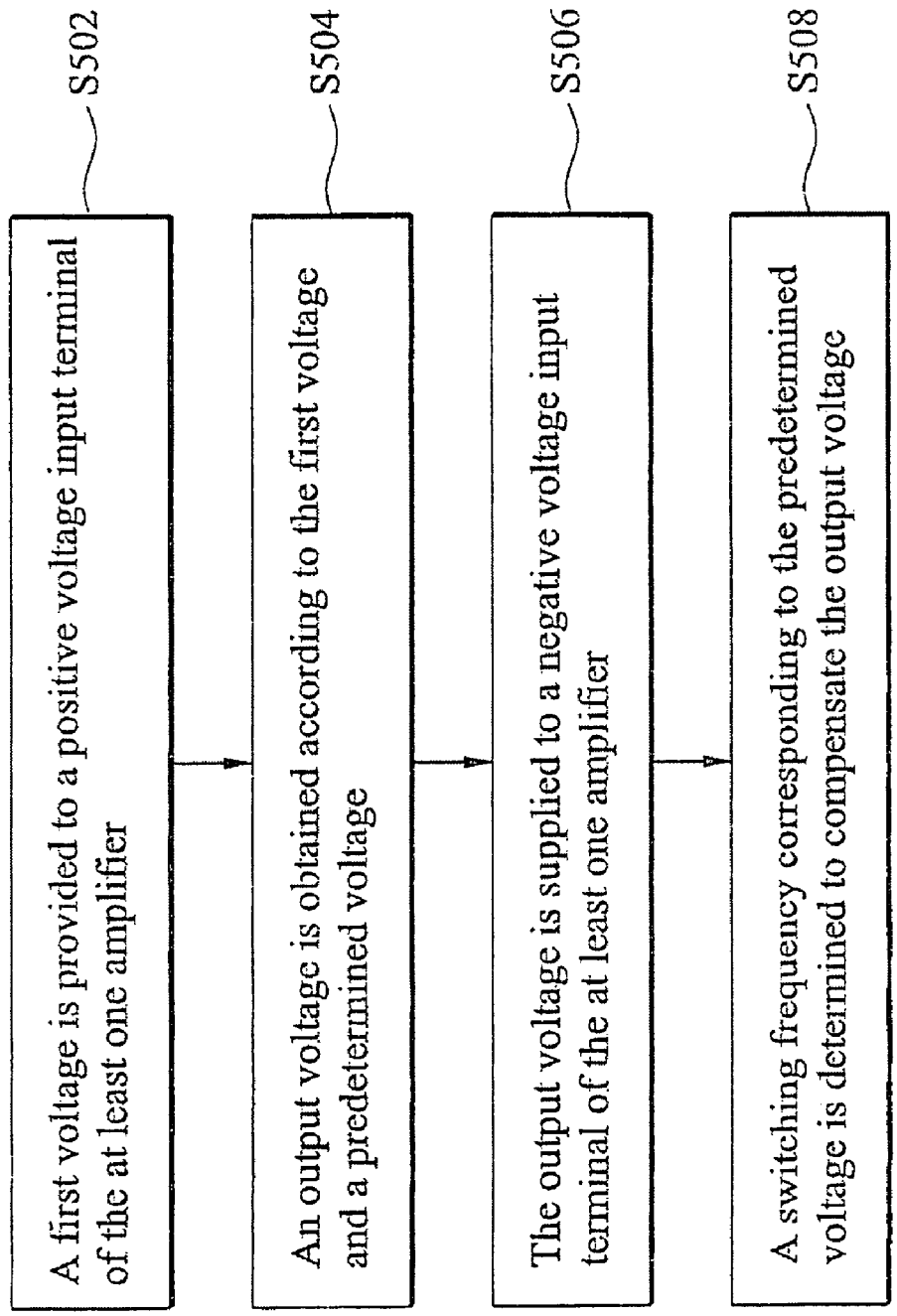
FIG. 5 is a flowchart of a voltage generating method for driving at least one amplifier in accordance with the invention.

FIG. 5 is a flowchart of a voltage generating method for driving at least one amplifier according to the invention. As mentioned above, the process starts with the generation of a first voltage provided to a positive voltage input terminal of the at least one amplifier (step s502), such as an operational amplifier, where the first voltage is a positive DC voltage.

Afterwards, an output voltage is obtained according to the first voltage and a predetermined voltage (step s504). Note that the output voltage is a negative DC voltage. Thereafter, the output voltage is then supplied to a negative voltage input terminal of the at least one amplifier (step s506). The at least one amplifier is then powered by an upper supply rail of the first voltage and a lower supply rail of the output voltage. In this embodiment, the first voltage and the output voltage are supplied to the at least one amplifier for audio signal amplification.

Finally, according to the output voltage, a switching frequency corresponding to the predetermined voltage is determined to adjust the output voltage (step s508). As described above, the output voltage is increased when the switching frequency is decreased. Further, the output voltage is decreased when the switching frequency is increased. That is, the predetermined voltage is inversely proportional to the switching frequency from the aforementioned description. Therefore, the voltage level of the output voltage can be compensated for and held constant by the predetermined voltage according to the switching frequency. It is more preferable to directly adjust the output voltage by an extra voltage. In one embodiment, the extra voltage is supplied from a current source controller. By utilizing the extra voltage, it is possible to carry out an adjustment of the output voltage when the negative magnitude of input signals of the at least one amplifier is changed.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage generating apparatus for driving at least one amplifier comprising:
    a voltage source for providing a first voltage, wherein the first voltage is a positive DC voltage outputted to a positive voltage input terminal of the at least one amplifier;
    a switched capacitor voltage converter coupled to the voltage source for outputting an output voltage to a negative voltage input terminal of the at least one amplifier according to the first voltage and a predetermined voltage, wherein the output voltage is a negative DC voltage; and
    a voltage detector coupled to the switched capacitor voltage converter for determining a switching frequency corresponding to the predetermined voltage according to the output voltage,
    wherein the switched capacitor voltage converter increases the output voltage when the switching frequency is decreased and decreases the output voltage when the switching frequency is increased.

2. The voltage generating apparatus as claimed in claim 1, wherein the first voltage and the output voltage are supplied to the at least one amplifier for audio signal amplification.

3. The voltage generating apparatus as claimed in claim 1, wherein the predetermined voltage is inversely proportional to the switching frequency.

4. The voltage generating apparatus as claimed in claim 3, wherein the output voltage is determined by the following formula:

$$V_{out} = -V_{in} + V_c,$$

wherein $V_{out}$ is the output voltage, $V_{in}$ is the first voltage and $V_c$ is the predetermined voltage.

5. The voltage generating apparatus as claimed in claim 1, wherein the voltage generating apparatus further comprises a current source controller coupled to the switched capacitor voltage converter for supplying an extra voltage to directly adjust the output voltage.

6. The voltage generating apparatus as claimed in claim 5, wherein the output voltage is set as a function of the first voltage, the predetermined voltage and the extra voltage, according to the following formula:

$$V_{out} = -V_{in} + V_c + (+/-V_{ei}),$$

wherein $V_{out}$ is the output voltage, $V_{in}$ is the first voltage, $V_c$ is the predetermined voltage, and $V_{ei}$ is the extra voltage.

7. The voltage generating apparatus as claimed in claim 1, wherein the at least one amplifier is an operational amplifier.

8. A voltage generating method for driving at least one amplifier comprising:
    providing a first voltage to a positive voltage input terminal of the at least one amplifier, wherein the first voltage is a positive DC voltage;
    generating an output voltage according to the first voltage and a predetermined voltage, wherein the output voltage is a negative DC voltage;
    supplying the output voltage to a negative voltage input terminal of the at least one amplifier; and
    determining a switching frequency corresponding to the predetermined voltage according to the output voltage, wherein the output voltage is increased when the switching frequency is decreased and is decreased when the switching frequency is increased.

9. The voltage generating method as claimed in claim 8, wherein the first voltage and the output voltage are supplied to the at least one amplifier for audio signal amplification.

10. The voltage generating method as claimed in claim 8, wherein the predetermined voltage is inversely proportional to the switching frequency.

11. The voltage generating method as claimed in claim 10, wherein the output voltage is determined by the following formula:

$$V_{out} = -V_{in} + V_c,$$

wherein $V_{out}$ is the output voltage, $V_{in}$ is the first voltage and $V_c$ is the predetermined voltage.

12. The voltage generating method as claimed in claim 8, further comprising:
    supplying an extra voltage to directly adjust the output voltage.

13. The voltage generating method as claimed in claim 12, wherein the output voltage is set as a function of the first voltage, the predetermined voltage and the extra voltage, according to the following formula:

$$V_{out} = -V_{in} + V_c + (+/-V_{ei}),$$

wherein $V_{out}$ is the output voltage, $V_{in}$ is the first voltage, $V_c$ is the predetermined voltage, and $V_{ei}$ is the extra voltage.

14. The voltage generating method as claimed in claim 8, wherein the at least one amplifier is an operational amplifier.

* * * * *